United States Patent [19]

Bluzer

[11] Patent Number: 4,499,590
[45] Date of Patent: Feb. 12, 1985

[54] SEMICONDUCTOR CIRCUIT FOR COMPRESSING THE DYNAMIC RANGE OF A SIGNAL

[75] Inventor: Nathan Bluzer, Silver Springs, Md.

[73] Assignee: Westinghouse Electric Corp., Pittsburgh, Pa.

[21] Appl. No.: 458,223

[22] Filed: Jan. 14, 1983

Related U.S. Application Data

[63] Continuation-in-part of Ser. No. 327,155, Dec. 3, 1981, abandoned.

[51] Int. Cl.³ .................... G11C 19/28; H01L 29/78; H01L 27/14; H01L 31/00
[52] U.S. Cl. ............................... 377/60; 377/61; 357/24; 357/30
[58] Field of Search ............... 357/24, 30; 377/57–63; 307/311

[56] References Cited

U.S. PATENT DOCUMENTS

| | | | |
|---|---|---|---|
| 4,210,825 | 7/1980 | Crochiere et al. | 357/24 |
| 4,377,755 | 3/1983 | Jensen | 357/24 |

*Primary Examiner*—Gene M. Munson
*Attorney, Agent, or Firm*—W. G. Sutcliff

[57] ABSTRACT

A circuit for compressing the dynamic range of a signal is described incorporating a semiconductor substrate, a charge barrier formed in the substrate having an aperture, charge indicative of the signal is introduced on one side of the barrier, two conductive regions spaced apart from said aperture for attracting the charge through the aperture and to its region. The charge being divided between the two regions as a function of the potential of each region, one of which may be fixed and the other allowed to float. Two potential wells of a charge-coupled device may be substituted for the two conductive regions having gate electrodes to provide a predetermined potential well for attracting charge. Alternatively, one conductive region and one potential well may be spaced apart from said aperture for attracting the charge to the aperture. The circuit may be combined with a photodetector on a semiconductor substrate. The circuit overcomes the problem of transferring signals having a greater dynamic range than what conventional circuitry can handle such as a CCD shift register. The circuit further overcomes the problem of compressing a summed signal as additional signals are added to it.

24 Claims, 14 Drawing Figures

SEMICONDUCTOR CIRCUIT FOR COMPRESSING THE DYNAMIC RANGE OF A SIGNAL

GOVERNMENT CONTRACT

The Government has rights in part of this invention as defined by certain claims pursuant to Contract No. N00173-79-C-0485 awarded by the Naval Research Laboratory.

CROSS-REFERENCE TO RELATED APPLICATION

This is a continuation-in-part of application Ser. No. 327,155, filed Dec. 3, 1981 by the present inventor and owned by the present assignee, now abandoned.

BACKGROUND OF THE INVENTION

1. Field of the Invention

This invention relates to semiconductor circuits and more particularly to a charge-coupled device (CCD) circuit for compressing the dynamic range of a signal such as from a photodetector.

2. Description of the Prior Art

Many applications require compression of a signal having a large dynamic range into a signal with a smaller dynamic range to facilitate processing of the signal. For example, visible and infrared sensors or photodetectors experience a wide dynamic range. The large dynamic range sometimes exceeds the capability of charge-coupled devices which process the electrical signals obtained from the optical sensor. For example, semiconductor focal plane arrays and line arrays all fabricated on one integrated circuit chip may have their signals transferred within the chip to a suitable output terminal by utilizing a charge-coupled device chip register. The optical sensor may produce an electrical signal with the dynamic range being larger than what the charge-coupled device processor can handle.

The transformation from a large dynamic range to a smaller dynamic range is preferably a non-linear function. At low signal levels, the signal-to-noise ratio is small; thus compression of a low level signal will also compress the shot noise level associated with the signal. Attenuation of the shot noise associated with the optical signal will make the processor noise or system noise, arising from the electrical circuits, much more significant and thereby cause a reduction in the signal to noise ratio. At high signal levels, the shot noise associated with the signal is larger, hence compression of the signal will still provide a sufficient noise level to dominate over the circuit or system noise. The photon shot noise occurs because of the quantized nature of optical signals.

It is therefore desirable to provide a device for compressing the dynamic range of an input signal such that at low signal levels the attenuation is small and at large signal levels the attenuation is large, i.e. non-linear.

It is further desirable to provide a charge-coupled device for utilizing a depleted semiconductor region having therein a potential gradient towards each of at least two electrodes for dividing the charge passing into the region.

It is further desirable to provide a charge-coupled device for utilizing a depleted semiconductor region having therein a potential gradient towards each of at least two potential wells for dividing the charge passing into the region.

It is further desirable to provide a charge-coupled device for utilizing a depleted semiconductor region having therein a potential gradient towards a potential well and towards an electrode for dividing the charge passing into the region.

It is further desirable to incorporate dynamic range compression as a function of the charge in a well of a charge-coupled device by dividing any additional charge entering the region between the charge-coupled device well and either an electrode or second potential well according to the charge collected in the CCD's potential well.

It is further desirable to perform time delay integration incorporating a plurality of input stages coupled in parallel to a shift register where the charge inserted into the shift register is compressed as a function of the charge already in each particular bit position of the shift register.

It is further desirable to provide an externally programmable injection efficiency or gain adjustment for transferring charge into a charge-coupled device by dividing the input charge between the charge-coupled device and a second potential well or electrode.

It is further desirable to provide an externally programmable injection efficiency or gain which may be adjusted as a function of time to compensate for attenuation in signals such as a radar or optical signal reflected from a target at various ranges.

SUMMARY OF THE INVENTION

In accordance with the present invention, a device for compressing the dynamic range of an input signal is described comprising a semiconductor substrate having a region doped with impurities suitable for forming a depletion mode channel therein, charge barriers within the channel defining an aperture of predetermined width for passing charge in between the barrier regions, at the aperture's exit port side, two charge collecting regions are disposed on either side of the aperture. A first charge collecting region is positioned adjacent to one side of the aperture's exit port for generating a first electric field extending into the channel for attracting charge passing through the aperture. A second charge collecting region is positioned opposite the first charge collecting region for generating a second electric field extending into the channel for attracting charge passing through the aperture. The potentials of the first and second charge collecting regions being sufficient to deplete the channel between the first and second charge collecting regions of majority charge carriers and to attract the charge carriers exiting from the aperture into the channel. The spatial dependence and value of the electric field in the channel region, bordered by the aperture and the two charge collecting regions, is a function of the space charge density and a superposition of the potentials on the two charge collecting regions. In one embodiment, the first charge collecting region is reset to a predetermined voltage and then allowed to float whereas the second charge collecting region is coupled to a voltage supply to maintain a fixed voltage potential.

Specifically the charge collecting regions may be conductive regions of N or P-type material adjacent to the channel. Or, the charge collecting regions may be a conducting region on one side of the channel and a potential well on the other side. The potential well may be formed by an electrode above the potential well and insulated therefrom. Or, the charge collecting regions may include first and second potential wells positioned on either side of the channel wherein charge passing in a CCD channel through the aperture is divided by the potential maximum between the two potential wells. The two potential wells may in themselves collect charge or may be coupled to a second well or conducting region for holding or conducting the charge away.

DESCRIPTION OF THE PREFERRED EMBODIMENT

Figure 1:
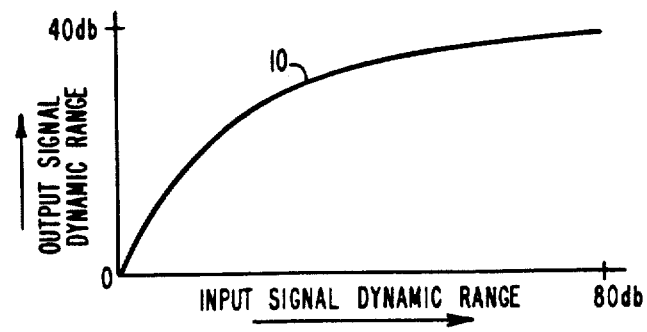
FIG. 1 is a graph showing the input versus the output dynamic range of a signal whose dynamic range has been compressed.

Referring to the drawing and in particular to FIG. 1, curve 10 shows the input signal dynamic range versus the output signal dynamic range. The compression of the input signal dynamic range as illustrated by curve 10 is a non-linear transfer characteristic. In FIG. 1, the ordinate represents output signal dynamic range and the abscissa represents input signal dynamic range.

Figure 2:
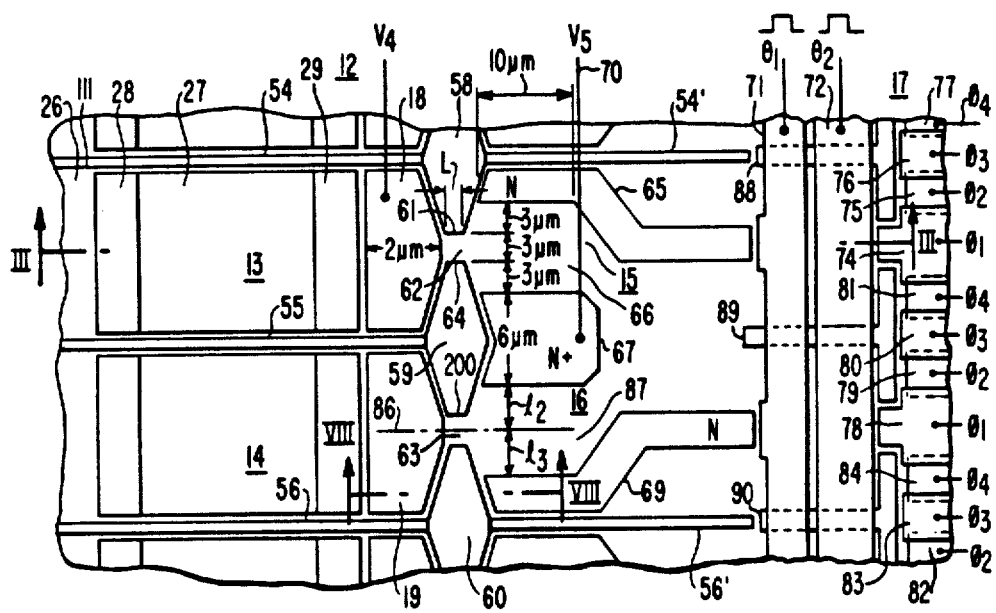
FIG. 2 shows one embodiment of the invention.

Referring to FIG. 2, a sensor 12 of radiant energy is shown having a plurality of detectors 13 and 14, dynamic range compression circuits 15 and 16, and a parallel in, serial out CCD shift register 17. Sensor 12 may for example detect radiant energy in the visible or infrared region having an output over a large dynamic range such as 80 db. Dynamic range compression circuits 15 and 16 may compress the signals which are in the form of charge injected from underneath gates 18 and 19 respectively the apertures 62 and 63 for the purpose of dynamic range compression.

Figure 3:
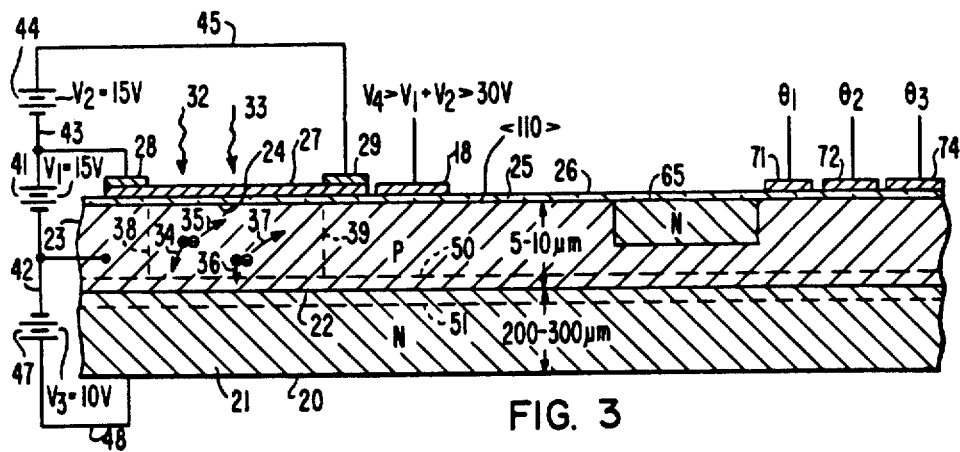
FIG. 3 is a cross-section view along the lines III—III of FIG. 2.

FIG. 3 is a cross-section view along the lines III—III of FIG. 2 illustrating in more detail the structure of detector 13, dynamic range compression circuit 15, and CCD shift register 17. Referring to FIG. 3, semiconductor substrate 20 which may, for example, be silicon, geranium, gallium arsenide, etc. has a first layer 21 doped with N type impurities having an upper surface 22. A layer 23 doped with P type impurities is deposited over layer 21 contiguous with upper surface 22. Layer 21 may for example be 200 to 300 micrometers thick and layer 23 may for example be in the range of 5 to 10 micrometers thick. On upper surface 24 of layer 23 is a layer of dielectric or oxide 25. On upper surface 26 of dielectric or oxide layer 25 is deposited a resistive layer or film 27 having two low resistance ohmic contact regions 28 and 29 at either end of the film which may be contacted for example by deposition of a material such as aluminum. Resistive film 27 is transparent to radiant energy shown by arrows 32 and 33 which pass through resistive film 27 into layer 23. Radiant energy 32 may be absorbed in layer 23, generating hole-electron pairs; one such pair is shown by arrows 34 and 35, respectively. Radiant energy 33 may be absorbed in layer 23, by generating a hole-electron pair shown by arrows 36 and 37, respectively. Reference lines 38 and 39 show the width of detector 13 with the depth being the thickness of layer 23 plus the depletion width from upper surface 22 to reference line 51. Layer 23 may be doped with an impurity concentration such as $1 \times 10^{14}$ atoms/cm$^3$ to form P type material. The low impurity concentration enables the formation of a large depletion region by the positively biased resistive film 27. Battery or voltage source 41 is coupled to layer 23 over line 42. The other side of voltage source 41 is coupled over line 43 to contact region 28 and to the negative side of voltage source or battery 44. The other side of voltage source 44 is coupled over line 45 to contact region 29. The potential $V_2$ of voltage source 44 may for example be 15 volts. The potential $V_1$ of voltage source 41 may for example be 15 volts. The positive potential of contact regions 28 and 29 and the resistive film 27 therebetween is sufficient to cause a depletion region in layer 23 and to attract electrons shown by the arrows 35 and 37 to the region beneath contact 29.

Gate electrode 18 is coupled to a voltage source $V_4$ which has a positive voltage greater than the voltage of $V_1 + V_2$ or greater than 30 volts. The positive voltage on gate 18 causes a depletion region to form below gate 18 which has a potential more attractive for electronic charge located underneath contact region 29.

A battery or voltage source 47 has one side coupled to line 42 to layer 23 and the positive side coupled to layer 21 over line 48. Voltage source 47 may have a potential $V_3$ of 10 volts to cause a reverse bias junction to form between layers 23 and 21 which attracts holes 34 and 36 from layer 23 into layer 21 where they recombine with electrons. The region between reference lines 50 and 51 is depleted due to the voltage $V_3$ connected to layers 23 and 21.

Referring to FIG. 2, isolation grooves 54, 55 and 56 are formed in layer 23 below upper surface 24 to a depth, for example, of 10 micrometers to provide electrical isolation from adjacent detectors. For example, groove 55 provides isolation between detectors 13 and 14. If upper layer 23 is of silicon material and upper surface 24 is in the 110 crystallographic plane, then the sidewalls of grooves 54-56 are in the 111 crystalline plane and are orthogonal to the 110 surface. The electrical isolation provided by grooves 54 and 56 provide radiant energy detectors with low optical and electrical crosstalk.

Figure 8:
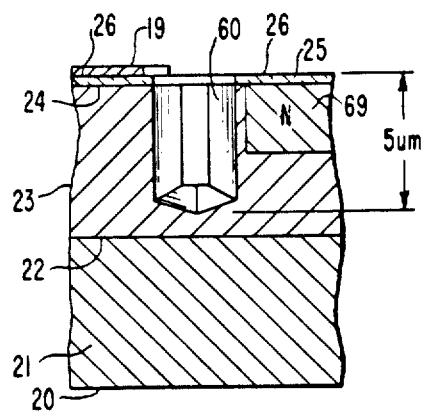
FIG. 8 is a cross-section view along lines VIII—VIII of FIG. 2.

Charge barrier regions 58-60 are spaced apart to form apertures 62 and 63 having a predetermined width W and length L for passing charge through the aperture ports located between and defined by barriers 58 and 59 or barriers 59 and 60. The width W may be, for example, 3 micrometers and the length L may be, for example, 1 to 3 micrometers. As shown in FIG. 2, barriers 58, 59 and 60 are diamond-shaped which may be formed by etching or removing material from layer 23 to a depth, for example, of 5 micrometers as shown in FIG. 8.

Figure 9:
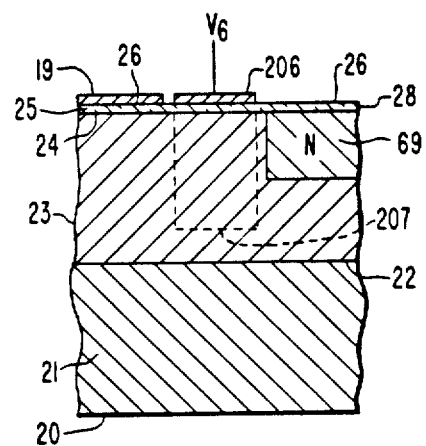
FIGS. 9 and 10 are alternate embodiments of the invention shown by a cross-section view along lines VIII—VIII of FIG. 2.

A first alternate embodiment for barriers 58–60 may be formed by an electrode 206 positioned on dielectric layer 25 on layer 23; a cross-section view of which is shown in FIG. 9 which corresponds to a cross-section view taken along line VIII—VIII of FIG. 2. A voltage $V_6$ may be applied to electrode 206 to provide a less attractive region underneath electrode 206 shown by reference line 207. If the region is less attractive to charge than the region underneath gates 18 or 19, then the region shown by reference line 207 will act as a barrier to the charge underneath gates 18 and 19. In FIG. 9 like references are used for functions corresponding to the apparatus of FIG. 2. Electrode 206 may be diamond shaped as shown in FIG. 2 for barriers 58–60 or it may have a different shape so long as it acts as a barrier to charge and yet permits the charge to travel along its edge to the aperture 62 or 63.

Figure 10:
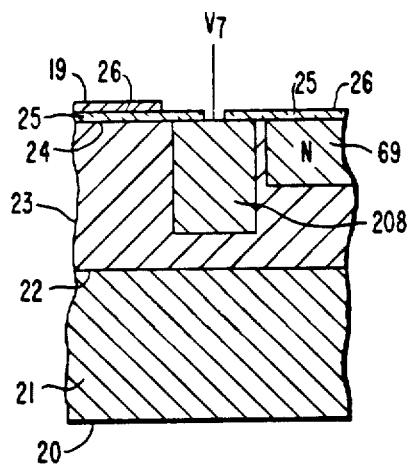

A second alternate embodiment for barriers 58–60 may be formed by a P-type region 208 in layer 23 as shown in FIG. 10. P-type region 208 is of the same type of material as layer 23 and may be formed by diffusion or ion implementation of impurities.

A voltage $V_7$ is coupled over line 209 to region 208. Voltage $V_7$ provides a less attractive region for charge compared to the region underneath gates 18 or 19 and therefore acts as a barrier to the charge underneath gates 18 and 19. The charge is confined underneath gates 18 and 19 except at apertures 62 and 63. Region 208 may be diamond shaped as shown in FIG. 2 for barriers 58–60 or it may have a different shape so long as it acts as a barrier to charge and yet permits the charge to travel along its edge to the aperture 62 or 63.

FIG. 10 corresponds to a cross-section view taken along line VIII—VIII of FIG. 2. In FIG. 10 like references are used for functions corresponding to the apparatus of FIG. 2.

A first charge collecting region 65 is positioned adjacent to charge barrier region 58 and adjacent to aperture 62 for generating an electric field having a potential gradient extending into the channel 66 which is the region between the first charge collecting region 65 and second charge collecting region 67. First charge collecting region 65 attracts a fraction of the charge passing through aperture 62.

Second charge collecting region 67 is positioned adjacent to barrier region 59 and near aperture 62 for generating an electric field having a potential gradient extending into the channel 66 as a function of its potential for attracting charge passing through aperture 62. First charge collecting region 65 may be an N type doped region formed in layer 23 having a width of 1.5–5.5 micrometers and extending at least 10 micrometers in distance from barrier region 58. Second charge collecting region 67 may be formed of N type impurities ion implanted or diffused into layer 23 having a width of for example 6 micrometers and a length of 10 micrometers out from barrier region 59.

As shown in FIG. 2, first charge collecting region 65 may be located 3 micrometers from the aperture's edge 61 and a second charge collecting region 67 may be located 3 micrometers from the aperture's edge 64. The width or opening of aperture 62 may for example be 3 micrometers. A third charge collecting region 69 doped with N type impurities is formed near aperture 63 and adjacent to charge barrier region 60. The second charge collecting region 67 is also positioned near aperture 63 and adjacent to barrier region 59. Aperture 63 has a center line 86. A voltage supply having a voltage $V_5$ is coupled over line 70 to the second charge collecting region 67. $V_5$ for example may have a voltage of 25 volts. Gates or electrodes 71 and 72 provide the means for transferring charge accumulated on charge collecting region 65 to a first bit position in the CCD shift register 17. Electrodes 71 and 72 also function to provide the means for transferring charge accumulated on third charge collecting region 69 to a second bit position in the CCD shift register 17 which may for example be a four-phase shift register. The potential of floating charge collecting regions 65 and 69 may be set to 35 volts by forming an attractive region to electrons underneath electrodes 71 and 72 which functions to reset charge collecting electrodes 65 and 69 to a 35 volt potential by removing the collected or integrated charge and injecting the charge into the CCD shift register 17.

The voltage on charge collecting regions 65 and 67 is sufficient to deplete the channel 66 of majority charges and to attract electrons injected into the channel 66 from the region underneath gate 18 and through aperture 62. As the charge passes into aperture 62, and out of the aperture's exit port, it is divided by the two potential gradients existing adjacent to the aperture's 62 exit port in channel 66 with a portion of the charge going to charge collecting region 65 and the remainder going to charge collecting region 67.

The charge division line is facilitated by the presence of the space charge region between the two charge collection regions 67 and 69. The space charge density is a direct function of the doping level because the space charge is generated when channel 87, between charge collection regions 67 and 69, is depleted of mobile charge carriers in this case holes. Correspondingly, the space charge in this example has a density of $1 \times 10^{14}$ electrons/cm$^3$. In vacuum tubes an analogous situation does not exist because there is no corresponding immobile space charge region. The immobile space charge in channel 87 provides the means for charge division by forming two attractive potential gradients between charge collecting regions 67 and 69. The depleted region between charge collection regions 67 and 69 has a predetermined space charge density determined by the doping concentration.

Charge carriers collected by the floating charge collecting region 69 will reduce the magnitude of the attractive potential at which the floating charge collecting region 69 was biased at. The charge collecting region 67 connected to a voltage supply $V_5$ remains at the same potential independent of the number of charge carriers which were collected by it. Charge carriers exiting from the aperture port are subjected to an attractive electric field produced by the voltage potentials present on the charge collecting regions. Also the charge carriers exiting from the aperture 63 are divided into two parts, the first part is attracted to and collected by the charge collection region 67 connected to a fixed potential, while the second part (i.e., charge balance) is attracted to and collected by the floating charge collecting region 69. At any point in time, the fraction of charge carriers, exiting at the aperture 63, which are collected by one charge collecting region versus the other is a function of the voltage potential present on each charge collecting region 67 and 69. In particular, the spatial location of the potential gradient magnitude minima adjacent to the aperture's 63 exit port determines the percentage of charge carriers collected by each charge collecting region. Specifically, all charge carriers exiting the aperture 63 and to the right of the potential gradient magnitude minima (charge division line) will be collected by the charge collecting region 69 disposed on the right side of the aperture's 63 exit port. And, all the charge carriers exiting the aperture's 63 exit port and to the left of the potential gradient magnitude minima will be collected by the charge collecting region 67 disposed on the left side of the aperture's 63 exit port. Location of the potential gradient magnitude minima can be moved across the aperture's 63 exit port by varying the voltage potentials on the charge collecting regions.

In operation, initially the location of the potential gradient magnitude minima is moved to one side of the aperture's exit port such that all the charge carriers exiting the aperture port will be collected by the floating charge collecting region. Accordingly, the potential on the floating charge collecting region is initially most attractive. As charge is collected on the floating charge collecting region, its potential becomes less attractive and the potential gradient magnitude minima begins to move across the aperture's exit port. With the movement of the location of the potential gradient magnitude minima the fraction of the charge exiting the aperture port collected by the floating charge collecting region decreases. The continued decrease of the charge fraction collected by the floating charge collecting region with the total amount of charge collected is responsible for a compressive transfer characteristic. Reset of the voltage potential on the floating charge collecting region by removing the collected charge initializes the entire cycle. The collected charge removed from the floating charge collecting region provides an output signal which represents the value of the input signal translated through a compressive transfer function.

The charge collected on charge collecting region 65 is transferred into the potential well located underneath electrode 74 by appropriate signals on gate electrodes 71 and 72. CCD serial shift register 17 may for example have four phases per bit $\phi_1$–$\phi_4$ with electrodes 74–77 representing one bit, electrodes 78–81 representing a second bit and electrodes 82–84 representing a portion of another bit in shift register 17. Charge from charge collecting region 69 is coupled by appropriate voltages on electrodes 71 and 72 into a potential well located underneath electrode 78 which represents a second bit in shift register 17. P+ diffusion 88 through 90 are CCD channel stops which function to contain the charge injected into shift register 17 and to maintain isolation between the charge signals injected into register 17 from charge collecting region 65 and from charge collecting region 69.

Grooves or slots 54' and 56' are shown extending colinear with grooves 54 and 56 respectively on the other side of charge barrier regions 58 and 60. Grooves 54' and 56' function to provide additional electrical isolation necessary between the charge collecting regions located on the other side of the charge barrier regions.

Figure 4:
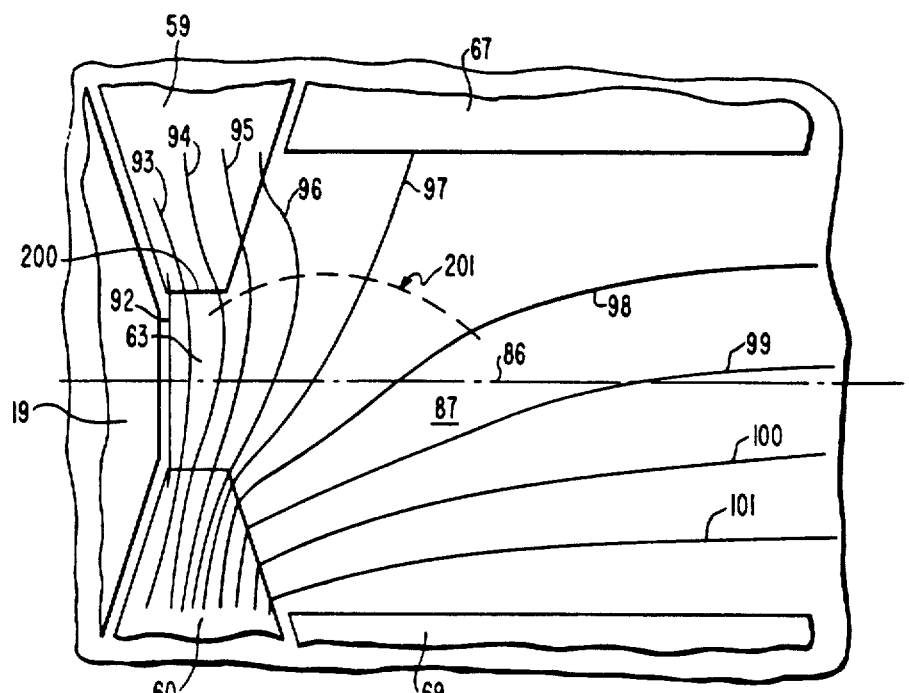
FIGS. 4 through 7 show a portion of FIG. 2 enlarged with typical equal potential lines that charge carriers encounter when they exit from the apertures exit port.

FIG. 4 shows a portion of FIG. 2 with equal potential lines added to illustrate the distribution of the potential in the region between aperture 63, second charge collecting region 67 and third charge collecting region 69, with the region between charge collecting regions 67 and 69 designated as channel 87. If charge collecting region 69 is at a potential of 35 volts and charge collecting region 67 is at a potential of 25 volts, then the potential gradient magnitude minima 201 will be located near edge 200 of aperture 63 hence electrons passing through aperture 63 exit port will primarily be collected by charge collecting region 69. In FIG. 4 curves 92–97 represent the equal potential lines of 20 volts through 25 volts respectively. Curves 98–101 represent the equal potential lines of 27, 29, 31, 33 and 35 volts, respectively.

Figure 5:
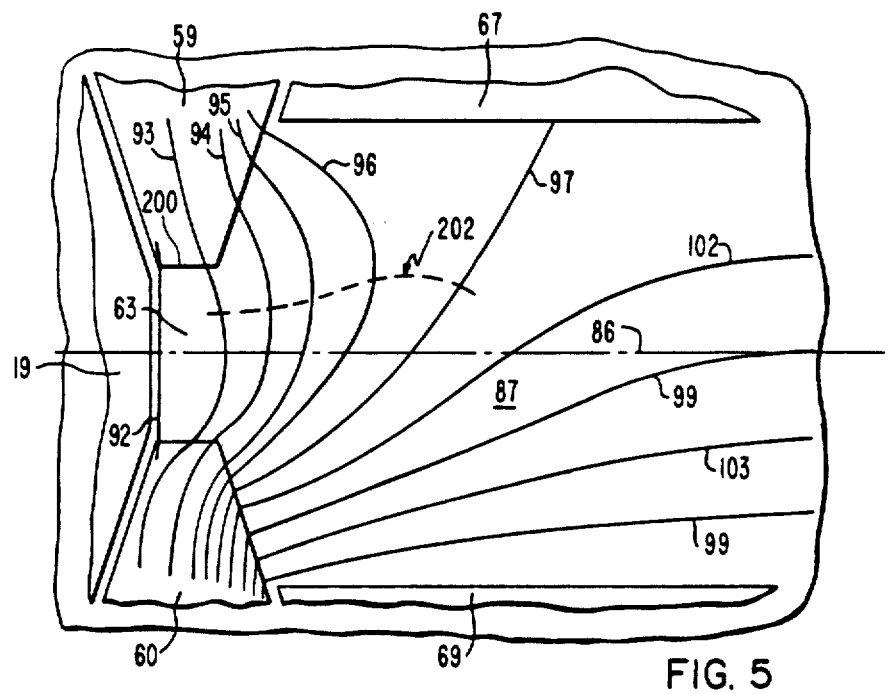

FIG. 5 shows the same portion of FIG. 2 as FIG. 4 with region 69 having an attractive voltage of 30 volts instead of 35 volts shown in FIG. 4. Curves 92–97 show the equal potential lines for 20 volts through 25 volts, respectively. Curve 102 shown in FIG. 5 shows the equal potential line for 26 volts. Curves 98 and 99 show the equal potential lines for 27 and 29 volts, respectively. Curve 103 shows the equal potential line for 28 volts shown in FIG. 5. The configuration of the equal potential lines shown in FIG. 5 is still such that the majority of carriers exiting the exit port of aperture 63 will be collected by the charge collecting region 69. Specifically, charge carriers exiting aperture 63 which are on the right side of the potential gradient magnitude minima 202 will be collected by charge collecting region 69. Furthermore, charge carrirs exiting aperture 63 on the left side of the potential gradient magnitude minima 202 will be collected by charge collecting region 67.

Figure 6:
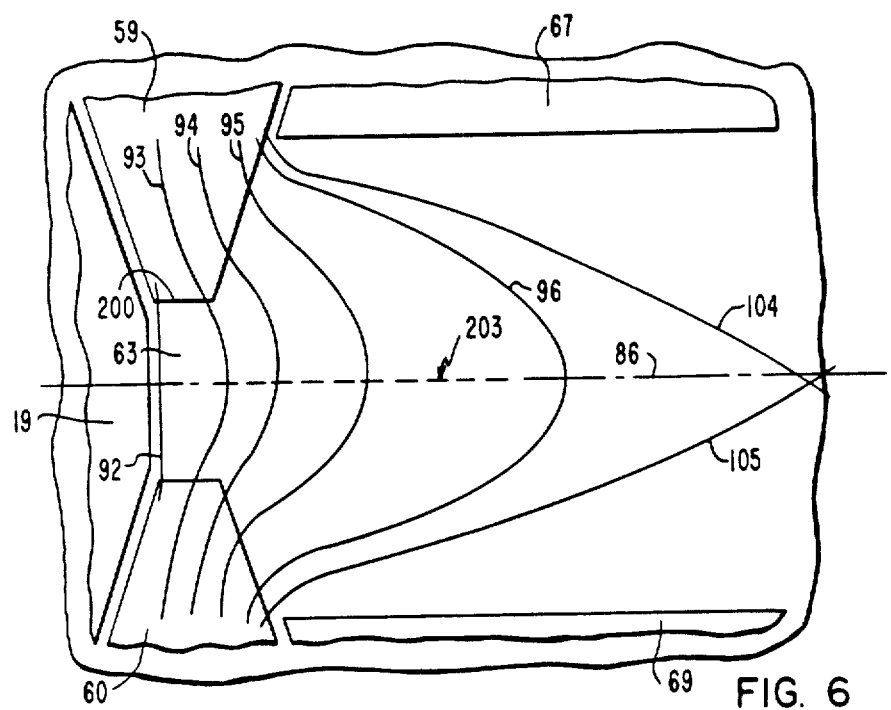

FIG. 6 shows the same portion of FIG. 2 as FIG. 4 with equal potential lines for the case where region 67 is 25 volts and region 69 is 25 volts.

Curves 92–96 show the equal potential lines for 21 volts through 24 volts, respectively. Curves 104 and 105 show the equal potential line for 24.2 volts. As shown in FIG. 6 the distribution of the equal potential lines are symmetric about the aperture's 63 center shown by reference line 86. Correspondingly, the location of the potential gradient magnitude minima 203 is centered between the two charge collecting regions 67 and 69. The charge in channel 87 exiting at aperture 63 are therefore likely to divide equally as it passes through aperture 63 and is collected by charge collecting regions 67 and 69.

Figure 7:
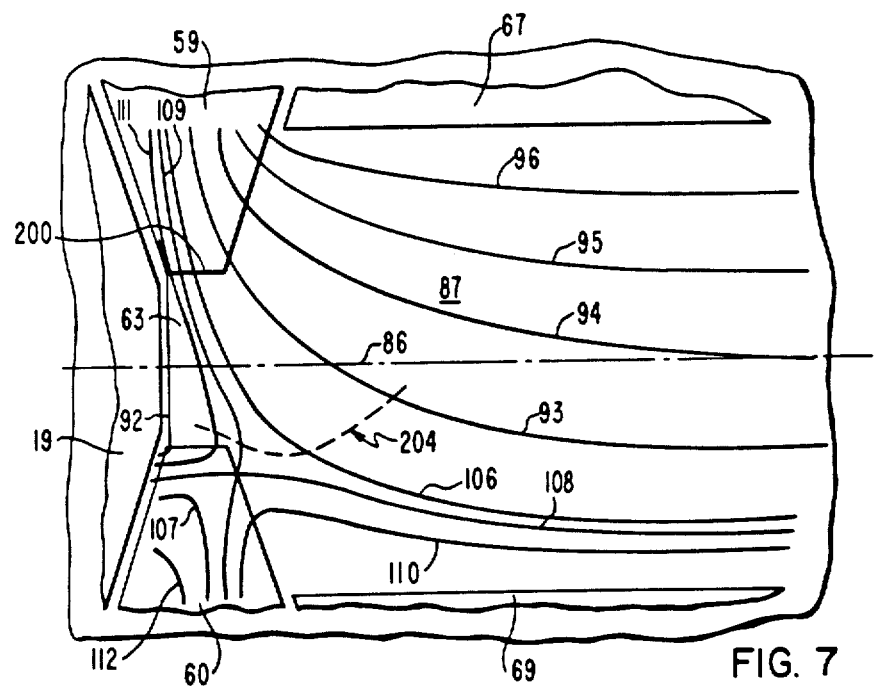

FIG. 7 shows the same portion of FIG. 2 as FIG. 4 with equal potential lines for the case where charge collecting region 67 is at 25 volts and charge collecting region 69 is at 20 volts. Curves 92–96 show the equal potential lines for 20 volts through 24 volts, respectively. Curves 106 and 107 show the equal potential lines for 20.4 volts. Curves 108 and 109 show the equal potential lines for 20.3 volts. Curves 110 and 111 show the equal potential line for 20.2 volts. Curve 112 shows the equal potential line for 20.6 volts. The configuration of the equal potential lines shown in FIG. 7 is such that the majority of charge passing through and exiting aperture 63 will flow along the potential gradient towards charge collecting region 67 where the charge will be collected. Specifically, charge carriers exiting aperture 63 on the right side of the potential gradient magnitude minima 204 will be collected by charge collecting region 67. Furthermore, charge carriers exiting aperture 63 on the left side of the potential gradient magnitude minima 204 will be collected by charge collection region 67.

The change of voltage on region 69 is determined by the amount of charge Q collected by region 69 divided by its capacitance C. The expression for $\Delta V$ of region 69 is $\Delta Q/C$.

Figure 11:
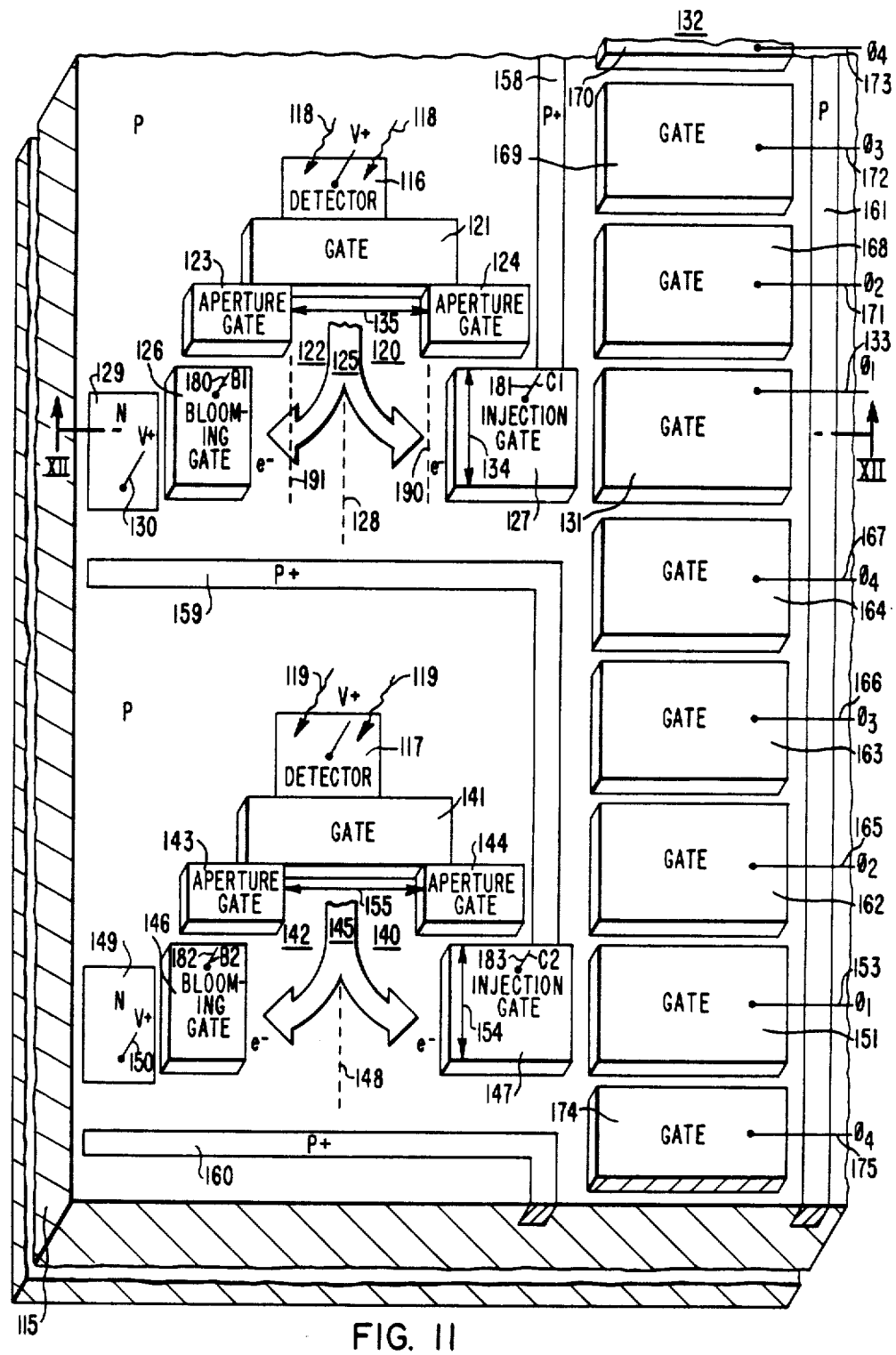
FIG. 11 shows an alternate embodiment of the invention.

Referring to FIG. 11, an alternate embodiment of the invention is shown. A substrate 115 which may, for example, be a P-type silicon material has detectors 116 and 117 therein. In response to radiant energy shown by arrows 118 and 119, photocharge is generated in detectors 116 and 117, respectively. Charge from detector 118 is attracted to channel 120 underneath gate 121. Charge underneath gate 121 passes through an aperture 122 formed by spaced-apart aperture gates 123 and 124. Charge 125, electrons, after passing between aperture gates 123 and 124 is subjected to a field produced by the space charge in the depleted region of the P-type material in channel 120 and to the electric field potential generated by blooming gate 126 and injection gate 127. A local potential maxima for electrons such as is shown by reference line 128 exists in channel 120 between blooming gate 126 and injection gate 127 so as to split charge 125 emerging from aperture 122 as a function of the position of the potential maximum line 128. A portion of charge 125 attracted underneath blooming gate 126 which may, for example, be at 15 volts is passed on to N region 129 which may, for example, be at 20 volts by means of a power supply voltage V coupled over line 130.

A portion of charge 125 is attracted underneath injection gate 127 and is transferred to a shift register 132 underneath gate 131. Control signal $\phi_1$ is coupled over line 133 to gate 131 which may be at, for example, 15 volts. Gate 127 may also be at 15 volts. The space between aperture gate 123 and 124 may be, for example, 6 micrometers as shown by arrow 135 and the width of gate 126 and 127 in the direction normal to aperture 122 may be, for example, 10 micrometers as shown by arrow 134 in FIG. 11.

In likewise manner charge from detector 117 is attracted in channel 140 to underneath gate 141. Charge from underneath gate 141 passes through aperture 142 formed by aperture gates 143 and 144 which are spaced apart as shown, for example, by arrow 155 which may, for example, be 6 micrometers. Charge 145 passing through aperture 142 is attracted to underneath blooming gate 146 and injection gate 147 which are spaced apart from one another and positioned so that charge 145 passing through aperture 142 will pass therebetween. Charge underneath blooming gate 146 is attracted by conducting region 149 which may be of N-type material. Region 149 is coupled over line 150 to voltage supply V which may, for example be at 20 volts. Another portion of charge 145 is attracted underneath injection gate 147 which may, for example, be at 15 volts. The charge from underneath injection gate 147 is attracted to underneath gate 151 which may be at 15 volts by means of control signal $\phi_1$ which is coupled to gate 151 over line 153. The width of blooming gate 146 and injection gate 147 may, for example, be 10 micrometers as shown by arrow 154. The potential on gates 146 and 147 and the space charge in channel 140 provide or determine a potential maximum line 148 from which charge 145 on either side of line 148 is attracted to gate 146 or gate 147, respectively.

P regions 158 through 161 provide channel stops to comfine the charge in channels 120, 140 and shift register 132. Gates 162 through 164 are positioned between gates 151 and 131 and are coupled to control signals $\phi_2$, $\phi_3$ and $\phi_4$, respectively, over lines 165 through 167, respectively. Gates 168 through 170 are shown on the other side of gate 131 and are coupled to control signals $\phi_2$, $\phi_3$ and $\phi_4$, respectively, by way of lines 171 through 173, respectively. Gate 174 on the other side of gate 151 is coupled to control signal $\phi_4$ over line 175. As shown in FIG. 11, shift register 132 is a four-phase shift register for transferring charge in a serial direction with parallel inputs to shift register 132 by means of injection gates 127 and 147 which inject charge into two adjacent bit positions in shift register 132.

Blooming gate 126 is controlled by control signal B1 coupled over line 180. Injection gate 127 is controlled by signal C1 coupled over line 181. Blooming gate 146 is controlled by control signal B2 coupled over line 182. Injection gate 147 is controlled by control signal C2 coupled over line 183.

Figure 12:
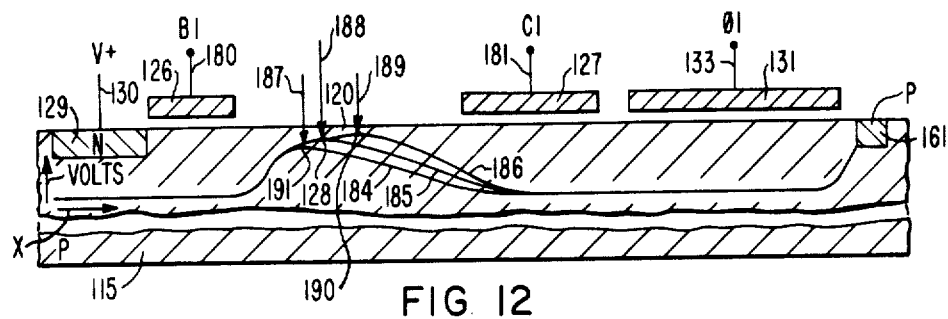
FIG. 12 is a cross-section view along the lines XII—XII of FIG. 11.

Referring to FIG. 12, the potential in channel 120 and underneath gates 126, 127 and 131 is shown along with a cross-section view along the lines XII—XII of FIG. 11. In FIG. 12 curves 184, 185 and 186 show the potential of the depleted region within substrate 115 in the direction X for three different circumstances. The ordinate represents potential in volts. Curve 184 shows the potential, especially in channel 120 where the voltage on gate 126 is less than the voltage on gate 127 such that the potential maximum line is further from gate 127 than gate 126. Arrow 187 in FIG. 12 indicates the position of the potential line maxima for electrons 191 shown in FIG. 11 or the maximum electron potential of curve 184. Charge leaving aperture 122 will be divided at the position of potential maximum line 191 indicated by arrow 187 such that the charge on the right side will flow underneath gate 127 and the charge on the left side will flow underneath gate 126. If charge 125 is evenly distributed across aperture 122 then the charge division will be a function of the location of the potential maximum line.

Curve 185 shows the potential in substrate 115 for the case where the voltage on gates 126 and 127 are equal such as 15 volts and the potential maximum line 128 shown in FIG. 11 has its position indicated by arrow 188 which is midway between gate 126 and 127. Charge 125 if evenly distributed across aperture 122 will be divided equally with one part going underneath gate 126 and the other portion going underneath gate 127.

Curve 186 shows the potential or depleted region in substrate 115 for the case where the voltage on gate 126 is greater than the voltage on gate 127 so that the region below gate 126 is more attractive to charge than the region below 127. The position of the electron's potential maximum line 190 is shown in FIG. 11 is indicated by arrow 189 in FIG. 12. Charge 125 exiting aperture 122 will be split or divided into two portions by electron's potential maximum line 190 such that a large portion will flow underneath gate 126 and a small portion will flow underneath gate 127. The charge which flows underneath gate 126 will be attracted to N region 129 maintained at voltage V and will be collected by N region 129 and removed over line 130. Charge which flows underneath gate 127 will also flow underneath gate 131 as shown by curve 186. When control signal C1 causes the region below gate 127 to be unattractive, all of the charge underneath gate 127 will flow underneath gate 131. The charge underneath gate 131 may be shifted to underneath gate 164 when control signal $\phi_4$ causes the region underneath gate 164 to be attractive to charge and control signal $\phi_1$ causes the region below gate 131 to be repulsive to charge. In this manner the charge is shifted within CCD shift register 132 which is well known in the art.

The potential maximum line in channel 120 may be shifted from position 187 to position 189 in discrete steps or continuously as a function of time by placing a programmable voltage as control signal B1 on gate 126.

By using a programmable voltage on gate 126, the input gain or division ratio of charge 125 that is directed to underneath gate 127 may be increased or decreased with time in a predetermined manner. For example, in situations where the signal amplitude is decreasing with time the input gain should be increased with time such as for radar and optical return signals reflected from a target. Furthermore by using a programmable control signal B1 on gate 126, the input gain may be controlled to prevent signal charge overload of the charge-coupled device well capacity underneath gates 127 and 131 from occurring.

Figure 13:
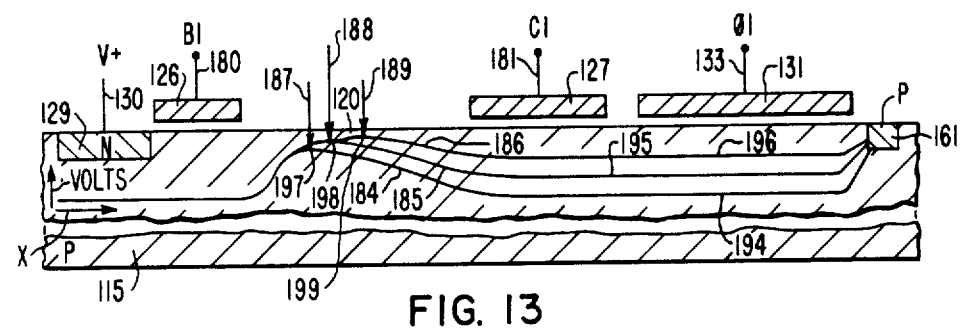
FIG. 13 is a cross-section view along the lines XII—XII of FIG. 11.

Special consideration is required to operate a time delay integration charge-coupled device with a non-linear input structure. A non-linear input structure coupled with a conventional time delay integration charge-coupled device will result in a non-unique transfer characteristic. In other words, in time delay integration an optical signal is summed from the output of many detectors looking at the same pixiel element in a field of view. If the input signal from each detector is compressed prior to summation then the total summation will be non-unique since the compression occurs prior to summation. This deleterious effect can be circumvented by employing the embodiment described in FIG. 11 and illustrated by FIG. 13 which is a cross-section view along the lines XII—XII of FIG. 11. As shown in FIGS. 11 and 13, the signal injected at any time delay integration (TDI) input of shift register 132 will depend on the charge accumulated in that well such as below gate 131 from all previous TDI injection sites or summations. Such a dependence between the signal present in the TDI well and the signal being injected will overcome the non-unique transfer characteristic feature occurring with conventional TDI structures with non-linear input cells. For example, in FIG. 13, curves 194, 195 and 196 show that as charge 125 is collected below gate 127 and 131 the potential for new charge is less attractive. As the region below gate 127 and 131 is less attractive the potential maximum line will shift from left to right, from potential maximum line 197 to 198 and then to 199, resulting in more charge being diverted to and underneath gate 126 and thereby compressing the signal below gate 131 as a function of and according to the magnitude of the charge collected in the potential well below gate 127 and 131.

Figure 14:
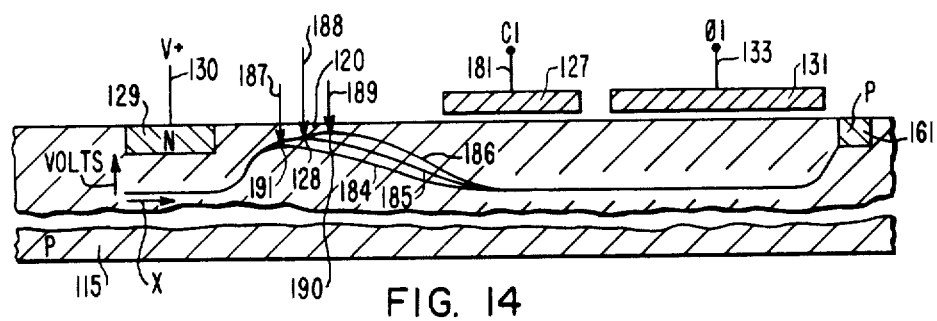
FIG. 14 is an alternate embodiment of the invention shown as a cross-section view.

An alternate embodiment of the invention is shown in FIG. 14 which is a cross-section view. In FIG. 14 like references are used for functions corresponding to the apparatus of FIG. 11. In FIG. 14 blooming gate 126 has been deleted from the structure shown in FIG. 11 and region 129 assumes the function of blooming gate 126 by varying the potential of region 129.

A device for compressing the dynamic range of an input signal has been described incorporating a semiconductor substrate having means for injecting charge into the substrate and conveying the charge indicative of the input signal to one side of a charge barrier, the charge barrier having a predetermined aperture or gap therein for passing the charge through the aperture whereupon it is collected by two regions after being divided in the proximate area of the aperture by an electric field having a potential gradient towards both regions. The dynamic range of the input signal is compressed by holding one region at a constant potential while the other region is allowed to float. Less charge is accumulated on the floating region as it changes in voltage due to the charge already collected.

The invention further provides a charge-coupled device gate structure for presetting the voltage on one of the regions and for collecting charge from this region indicative of the compressed signal. The gate structure may transfer the charge into a charge-coupled device shift register.

The invention further provides a structure comprising a charge-coupled device channel and aperture within the channel for charge to pass through and gates disposed on either side of said channel and pass said aperture for creating potential within the channel having a potential maxima position between the two gates to divide the charge passing through the aperture.

By varying the potential on one of the gates in a predetermined manner, a programmable gain charge-coupled device input structure is provided for application such as radar and optical return signals.

The invention further provides compression of the time delay integration signal by varying the portion of charge directed to a potential well as a function of the charge already in the potential well.

The invention further provides a structure where in place of one of the gates a conductive region is provided having a potential to provide a potential region in the channel having a potential maximum line in the channel between the connective region and a corresponding gate disposed oppositely on the other side of the channel.

I claim:

1. A device for compressing the dynamic range of an input signal comprising:
    a semiconductor substrate having a channel doped with impurities for forming a depletion mode channel therein and adapted for receiving charge indicative of said input signal,
    a charge barrier across said channel having an aperture of predetermined width for passing charge through said barrier from a first side to a second side of said barrier,
    a first region formed in said substrate positioned adjacent said second side of said barrier and to a first side of a center line through said aperture for generating a first electric field having a first potential gradient in said channel as a function of its potential for attracting charge passing through said aperture,
    a second region formed in said substrate positioned adjacent said second side of said barrier and to a second side of said center line through said aperture for generating a second electric field having a second potential gradient in said channel as a function of its potential for attracting charge passing through said aperture,
    first means for applying a first predetermined potential to said first region at selected times and for electrically isolating said first predetermined potential from said first region at other times to allow said first region to float electrically,
    second means for applying a second predetermined potential to said second region,
    said first and second predetermined potentials having a voltage sufficient to deplete the channel between said first and second regions of majority charge and to attract charge in said channel through said aperture from said first side to said second side, and
    means for generating an output signal indicative of the charge collected on said first region.

2. The device of claim 1 wherein said channel is doped with impurities having a density to provide a predetermined immobile space charge density when the channel is depleted.

3. The device of claim 1 wherein said channel is doped with impurities of $1 \times 10^{14}$ atoms/cm$^3$.

4. The device of claim 1 wherein said barrier includes a groove formed in said semiconductor substrate.

5. The device of claim 4 wherein said groove is at least 5 micrometers deep.

6. The device of claim 1 wherein said barrier includes an electrode positioned over said substrate and adapted for applying a potential to said electrode to repulse charge in the region underneath.

7. The device of claim 1 wherein said barrier includes a region of impurities of higher concentration than said substrate to form material of the same type as said substrate and adapted for applying a potential to said region to repulse charge in the region underneath.

8. The device of claim 1 wherein said semiconductor substrate is silicon and said impurities form P type material.

9. The device of claim 1 wherein said aperture is 3 micrometers wide.

10. The device of claim 1 wherein said first region is doped with impurities to form material of opposite type as said substrate.

11. The device of claim 1 wherein said second region is doped with impurities to form material of opposite type as said substrate.

12. The device of claim 1 wherein said first region includes a segment having its edge closest to said center line parallel to said center line.

13. The device of claim 1 wherein said second region includes a segment having its edge closest to said center line parallel to said center line.

14. The device of claim 1 wherein said first and second regions have edges extending from said barrier to a first predetermined distance away parallel to said center line and spaced from said center line by a second predetermined distance.

15. The device of claim 14 wherein said first predetermined distance is at least 10 micrometers.

16. The device of claim 14 wherein said second predetermined distance is at least 4.5 micrometers.

17. A sensor for detecting radiant energy over a first dynamic range and for providing an output over a second dynamic range less than said first dynamic range comprising:

a semiconductor substrate having a plurality of photodetecting regions adapted for receiving radiant energy and doped with impurities for absorbing radiant energy to generate hole-electron pairs, each said photodetecting region coupled to a respective channel in said semiconductor substrate doped with impurities for forming a depletion mode channel, each said photodetecting region including electrode means for collecting and transferring charge from said photodetecting region into said channel, each said channel includes a charge barrier across said channel having an aperture of predetermined width for passing charge through said barrier from a first side to a second side of said barrier, a first region formed in said substrate positioned adjacent said second side of said barrier and to a first side of a center line through said aperture for generating a first electric field having a first potential gradient in said channel as a function of its potential for attracting charge passing through said aperture, a second region formed in said substrate positioned adjacent said second side of said barrier and to a second side of said center line through said aperture for generating a second electric field having a second potential gradient in said channel as a function of its potential for attracting charge passing through said aperture, first means for applying a first predetermined potential to said first region at selected times and for electrically isolating said first predetermined potential from said first region at other times to allow said first region to float electrically, second means for applying a second predetermined potential to said second region, said first and second predetermined potentials having a voltage sufficient to deplete the channel between said first and second regions of majority charge and to attract charge in said channel through said aperture from said first side to said second side, and third means for generating an output signal indicative of the charge collected on said first region.

18. The sensor of claim 17 wherein said electrode means includes a dielectric layer on said semiconductor substrate above said photodetecting region, a resistive layer on said dielectric layer above said photodetecting region, having a first low resistance contact at an end nearest said channel and a second low resistance contact at the end opposite said first low resistance contact, fourth means for coupling a potential between said semiconductor substrate and said second low resistance contact, to form a depletion region in said photodetecting region, means for coupling a potential between said first and second low resistance contacts to form a depletion region in said photodetecting region and to attract electrons to the region beneath said first low resistance contact.

19. The sensor of claim 18 wherein said resistive layer is transparent to selected radiant energy.

20. The sensor of claim 18 wherein said resistive layer includes aluminum.

21. The sensor of claim 18 wherein said electrode means includes a gate electrode positioned above said semiconductor substrate on a dielectric layer and adjacent and between said photodetecting region and said charge barrier for transferring charge from beneath said first low resistance contact to said aperture.

22. The sensor of claim 17 wherein said semiconductor substrate includes a first layer of a first type of material and a second layer of a second type of material above said first layer, fourth means for coupling a potential between said first and second layers to form a reverse biased junction therebetween.

23. The sensor of claim 17 wherein at least one photodetector region is isolated by grooves in said semiconductor substrate extending from said barrier on each side of said aperture to along side said photodetector region and beyond said second contact.

24. A device to compress the dynamic range of an input signal comprising:

a semiconductor substrate, first means for generating charge in said semiconductor substrate as a function of said input signal, second means for channeling said charge in said substrate between first and second charge collectors, said first and second charge collectors each having a potential to generate an electric field in said channel to deplete said channel of majority carriers, the relative potential between said first and second charge collectors determining the relative portion of charge which is collected by said first charge collector, said first charge collector potential having an initial predetermined value which varies as charge is collected by said first charge collector such that an increase portion of the charge in the channel is collected by said second charge collector, and third means for generating an output signal indicative of the charge collected by said first charge collector.

* * * * *